US010685970B2

(12) United States Patent
Toh et al.

(10) Patent No.: US 10,685,970 B2
(45) Date of Patent: Jun. 16, 2020

(54) LOW COST MULTIPLE-TIME PROGRAMMABLE CELL ON SILICON ON INSULATOR TECHNOLOGY AND METHOD FOR PRODUCING THE SAME

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/001,485

(22) Filed: Jun. 6, 2018

(65) Prior Publication Data

US 2019/0378848 A1    Dec. 12, 2019

(51) Int. Cl.
*H01L 27/06* (2006.01)
*H01L 27/11521* (2017.01)
*G11C 16/10* (2006.01)
*G11C 16/04* (2006.01)
*H01L 27/11519* (2017.01)

(52) U.S. Cl.
CPC .... *H01L 27/11521* (2013.01); *G11C 16/0441* (2013.01); *G11C 16/10* (2013.01); *H01L 27/11519* (2013.01)

(58) Field of Classification Search
CPC ......... H01L 27/11521; H01L 27/11519; G11C 16/10; G11C 16/0441
See application file for complete search history.

(56) References Cited

U.S. PATENT DOCUMENTS

| | | | |
|---|---|---|---|
| 7,209,392 B2 | 4/2007 | Chen et al. | |
| 7,391,647 B2 | 6/2008 | Fang et al. | |
| 7,423,903 B2 | 9/2008 | Lin et al. | |
| 7,508,719 B2 | 3/2009 | Horch | |
| 7,542,342 B2 | 6/2009 | Kalnitsky et al. | |
| 2009/0001442 A1* | 1/2009 | Ozawa | H01L 21/84 257/315 |
| 2010/0084709 A1* | 4/2010 | Tsuchiya | H01L 21/823878 257/347 |
| 2011/0084709 A1* | 4/2011 | Asjes | H03K 17/955 324/658 |
| 2011/0092029 A1* | 4/2011 | Houston | G11C 11/412 438/128 |

(Continued)

*Primary Examiner* — Cuong B Nguyen
*Assistant Examiner* — Samuel Park
(74) *Attorney, Agent, or Firm* — Ditthavong & Steiner, P.C.

(57) ABSTRACT

A method of forming a low-cost and compact hybrid SOI and bulk MTP cell and the resulting devices are provided. Embodiments include forming a bulk region in a SOI wafer; forming an NW in the bulk region and a PW in a remaining SOI region of the SOI wafer; forming first and second pairs of common FG stacks over both of the SOI and bulk regions; forming a first shared N+ RSD between each common FG stack of the first and second pairs in a top Si layer; forming a N+ RSD in the top Si layer of the SOI region on an opposite side of each common FG stack from the first shared N+ RSD; forming a second shared N+ RSD between each common FG stack in the bulk region; and forming a P+ RSD between the first and second pairs in the bulk region.

14 Claims, 15 Drawing Sheets

(56) References Cited

U.S. PATENT DOCUMENTS

2011/0195566 A1* 8/2011 Ishigaki .......... H01L 21/823418
                                                            438/595
2013/0161722 A1* 6/2013 Son ........................ H01L 29/78
                                                            257/321

* cited by examiner

US 10,685,970 B2

LOW COST MULTIPLE-TIME PROGRAMMABLE CELL ON SILICON ON INSULATOR TECHNOLOGY AND METHOD FOR PRODUCING THE SAME

TECHNICAL FIELD

The present disclosure relates to memory design for semiconductor devices. The present disclosure is particularly applicable to fabricating multiple-time programmable (MTP) memory devices on silicon-on-insulator (SOI) technology such as fully-depleted silicon-on-insulator (FDSOI) technology.

BACKGROUND

Known MTP devices suffer from slow access time, a relatively small coupling ratio and/or a large cell size. Known solutions for improving the coupling ratio; however, involve additional costly masking steps.

A need therefore exists for methodology enabling fabrication of a low-cost and compact MTP cell on SOI technology with enhanced performance and scaling advantage.

SUMMARY

An aspect of the present disclosure is a method of forming a low-cost and compact hybrid SOI and bulk MTP cell.

Another aspect of the present disclosure is a compact hybrid SOI and bulk MTP cell.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a bulk region in a portion of a silicon on insulator (SOI) wafer; forming an n-type well (NW) in the bulk region in a silicon (Si) substrate of the SOI wafer and a p-type well (PW) in the Si substrate of a remaining SOI region of the SOI wafer; forming a first pair of common floating gate (FG) stacks and a second pair of common FG stacks over both of the SOI region and the bulk region, each common FG stack over a portion of the NW and over and perpendicular to a portion of the PW; forming a first shared N+ raised source/ drain (RSD) between each common FG stack of the first pair and the second pair in a top Si layer of the SOI wafer in the SOI region; forming a N+ RSD in the top Si layer of the SOI region on an opposite side of each common FG stack from the first shared N+ RSD; forming a second shared N+ RSD between each common FG stack of the first pair and the second pair in the Si substrate of the bulk region; and forming a P+ RSD between the first pair and the second pair in the Si substrate of the bulk region.

Aspects of the present disclosure include forming the bulk region by: forming a first pair of shallow trench isolation (STI) structures through the top Si layer, a buried oxide (BOX) layer of the SOI wafer, and a portion of the Si substrate, each first STI structure adjacent to and on an opposite side of the first pair of common FG stacks and the second pair of common FG stacks; forming a pair of second STI structures, laterally separated and perpendicular to the first pair of STI structures, through the top Si layer, the BOX layer, and the portion of the Si substrate; and removing the top Si layer and the BOX layer between the first pair of STI structures and the second pair of STI structures. Further aspects include forming a FG dielectric layer over a portion of the top Si layer of the SOI region and over a portion of the Si substrate of the bulk region prior to forming the first pair of common FG stacks and the second pair of common FG stacks. Another aspect includes forming the each common FG stack of the first pair and the second pair with a polysilicon gate layer or a metal gate layer. Additional aspects include forming a liner along each sidewall of each common FG stack of the first pair and the second pair; and forming a spacer along each liner, wherein each of the first shared N+ RSD, the N+ RSD, the second shared N+ RSD, and the P+ RSD are formed adjacent to a respective spacer. Further aspects include forming a first interlayer dielectric (ILD) layer over the SOI wafer subsequent to forming the P+ RSD; planarizing the first ILD; forming a source/drain (CA) contact through the ILD layer down to each of the first shared N+ RSD, the N+ RSD, the second shared N+ RSD, and the P+ RSD; forming a second ILD over the SOI wafer; planarizing the second ILD; forming a first metal layer in the second ILD on each CA over each of the first shared N+ RSD and the N+ RSD; and forming a second metal layer in the second ILD over and between the CA over each of the second shared N+ RSD and the P+ RSD.

Another aspect of the present disclosure is a device including: a bulk region in a portion of a SOI wafer; an NW in the bulk region in a Si substrate of the SOI wafer and a PW in the Si substrate of a remaining SOI region of the SOI wafer; a first pair of common FG stacks and a second pair of common FG stacks over both of the SOI region and the bulk region, each common FG stack over a portion of the NW and over and perpendicular to a portion of the PW; a first shared N+ RSD between each common FG stack of the first pair and the second pair in the SOI region in a top Si layer of the SOI wafer; a N+ RSD in the top Si layer of the SOI region on an opposite side of each common FG stack from the first shared N+ RSD; a second shared N+ RSD between each common FG stack of the first pair and the second pair in the Si substrate of the bulk region; and a P+ RSD between the first pair and the second pair in the Si substrate of the bulk region.

Aspects of the device include a first pair of STI structures through the top Si layer, a BOX layer of the SOI wafer, and a portion of the Si substrate, each first STI structure adjacent to and on an opposite side of the first pair of common FG stacks and the second pair of common FG stacks; and a pair of second STI structures, laterally separated and perpendicular to the first pair of STI structures, through the top Si layer, the BOX layer, and the portion of the Si substrate. Another aspect includes a dielectric layer over a portion of the top Si layer of the SOI region and over a portion of the Si substrate of the bulk region and under each common FG stack. Other aspects include each common FG stack of the first pair and the second pair including a polysilicon gate layer or a metal gate layer. A further aspect includes a liner along each sidewall of each common FG stack of the first pair and the second pair and each SG stack; and a spacer along each liner, wherein each of the first shared N+ RSD, the N+ RSD, the second shared N+ RSD, and the P+ RSD are formed adjacent to a respective spacer. Additional aspects include each of the first shared N+ RSD, the N+ RSD, the second shared N+ RSD, and the P+ RSD being an in situ doped RSD. A further aspect includes a first ILD layer over the SOI wafer; a CA contact through the ILD layer down to each of the first shared N+ RSD, the N+ RSD, the second shared N+ RSD, and the P+ RSD; a second ILD over the SOI wafer; a first metal layer in the second ILD on each CA over each of the first shared N+ RSD and the N+ RSD; and a second metal layer in the second ILD over and between the CA over each of the second shared N+ RSD and the P+ RSD.

A further aspect of the present disclosure is a device including a bulk region in a portion of a SOI wafer; an NW in the bulk region in a Si substrate of the SOI wafer and a PW in the Si substrate of a remaining SOI region of the SOI wafer; a first pair of common FG stacks and a second pair of common FG stacks over both of the SOI region and the bulk region, each common FG stack over a portion of the NW and over and perpendicular to a portion of the PW; a first shared N+ RSD between each common FG stack of the first pair and the second pair in the SOI region in a top Si layer of the SOI wafer; a second shared N+ RSD in the top Si layer on an opposite side of each common FG from the first shared N+ RSD; a SG stack, each SG stack over a portion of the PW on an opposite side of the second shared N+ RSD from the first shared N+ RSD; a N+ RSD in the top Si layer on an opposite side of the SG stack from the second shared N+ RSD; a third shared N+ RSD in the top Si substrate of the bulk region between each common FG of the first pair and the second pair; and a P+ RSD between the first pair and the second pair in the Si substrate of the bulk region.

Aspects of the present disclosure include a first pair of STI structures through the top Si layer, a BOX layer of the SOI wafer, and a portion of the Si substrate, each STI of the first pair adjacent to and on an opposite side of the first pair of common FG stacks and the second pair of common FG stacks; and a pair of second STI structures, laterally separated and perpendicular to the first pair of STI structures, through the top Si layer, the BOX layer, and the portion of the Si substrate. Another aspect includes a dielectric layer over a portion of the top Si layer of the SOI region and over a portion of the Si substrate of the bulk region and under each common FG stack. A further aspect includes each common FG stack of the first pair and the second pair and each SG stack including a polysilicon gate layer or a metal gate layer. Additional aspects include a liner along each sidewall of each common FG stack of the first pair and the second pair and each SG stack; and a spacer along each liner, wherein each of the first shared N+ RSD, the N+ RSD, the second shared N+ RSD, and the P+ RSD are formed adjacent to a respective spacer. A further aspect includes each of the first shared N+ RSD, the N+ RSD, the second shared N+ RSD, and the P+ RSD being an in situ doped RSD. Additional aspects include a first ILD layer over the SOI wafer; a CA contact through the ILD layer down to each of the first shared N+ RSD, the N+ RSD, the second shared N+ RSD, and the P+ RSD; a second ILD over the SOI wafer; a first metal layer in the second ILD on each CA over each of the first shared N+ RSD and the N+ RSD; and a second metal layer in the second ILD over and between the CA over each of the second shared N+ RSD and the P+ RSD.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of slow access time, small coupling ratio, large cell size and high cost factor attendant upon forming MTP cells on SOI technology. The problem is solved, inter alia, by forming a compact hybrid SOI and bulk MTP cell without any additional costly masking steps.

Methodology in accordance with embodiments of the present disclosure includes forming a bulk region in a portion of a SOI wafer. An NW is formed in the bulk region in a Si substrate of the SOI wafer and a PW is formed in the Si substrate of a remaining SOI region of the SOI wafer. A first pair of common FG stacks and a second pair of common FG stacks are formed over both of the SOI region and the bulk region, each common FG stack over a portion of the NW and over and perpendicular to a portion of the PW. A first shared N+ RSD is formed between each common FG stack of the first pair and the second pair in the SOI region in a top Si layer of the SOI wafer. A N+ RSD is formed in the top Si layer of the SOI region on an opposite side of each common FG stack from the first shared N+ RSD. A second shared N+ RSD is formed between each common FG stack of the first pair and the second pair in the Si substrate of the bulk region; and a P+ RSD is formed between the first pair and the second pair in the Si substrate of the bulk region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
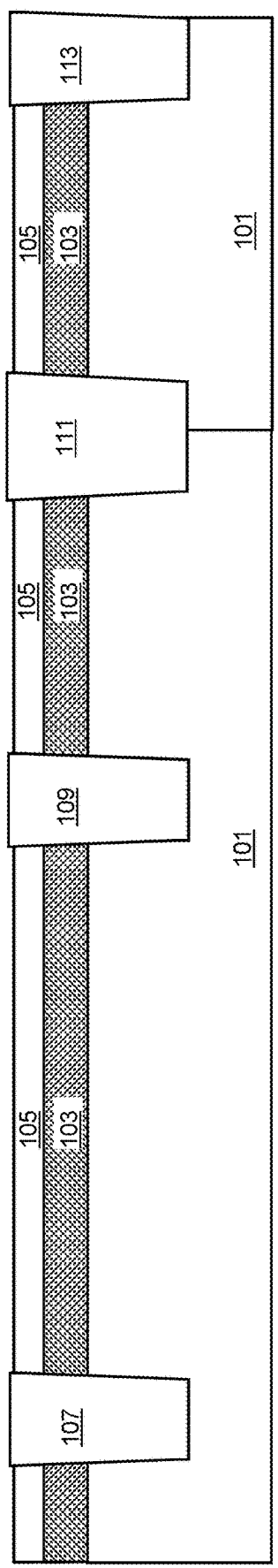
FIGS. 1 through 4, 6, 8 and 10 schematically illustrate cross-sectional views of a process flow for forming a 1 transistor and 1 capacitor (1T1C) MTP on a hybrid SOI and bulk region of a SOI wafer, in accordance with an exemplary embodiment.
Figure 2:
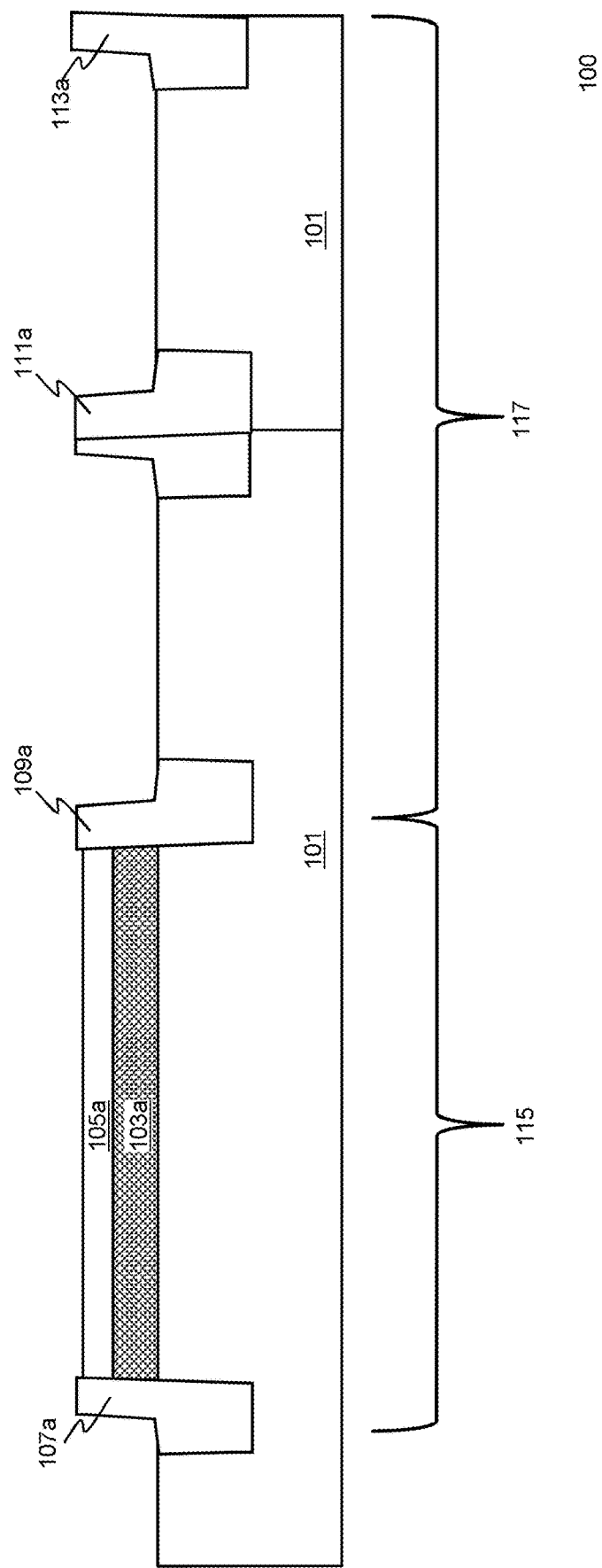
Figure 3:
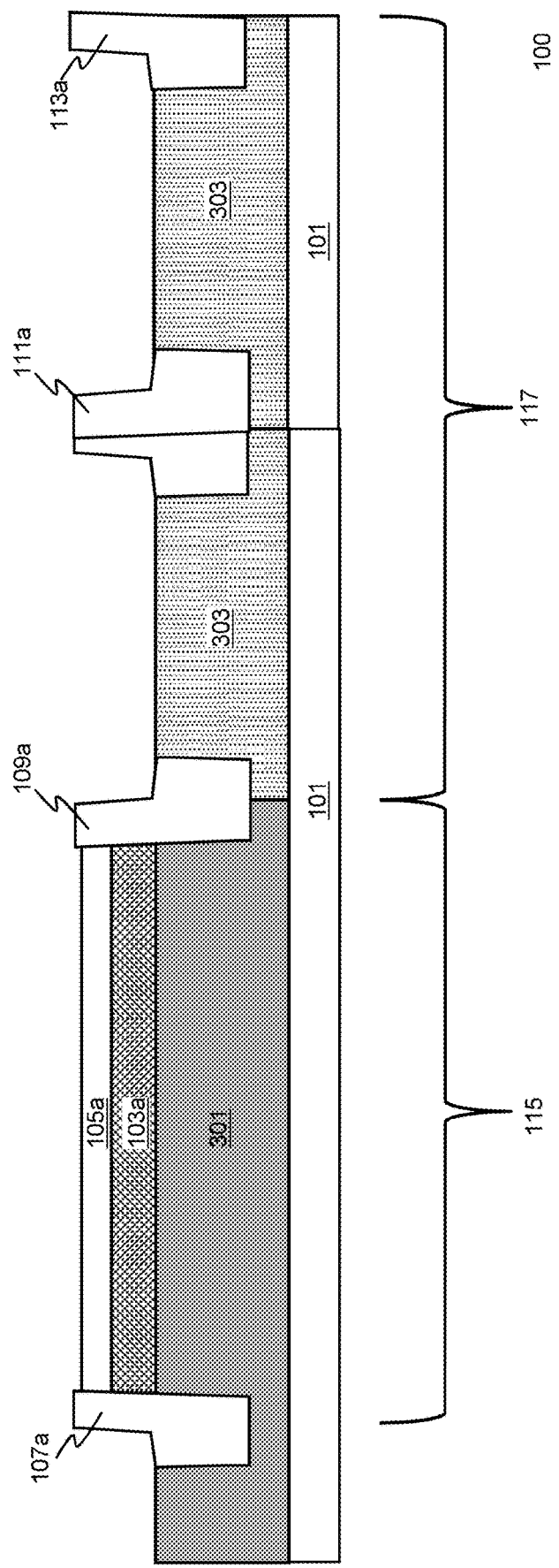
Figure 4:
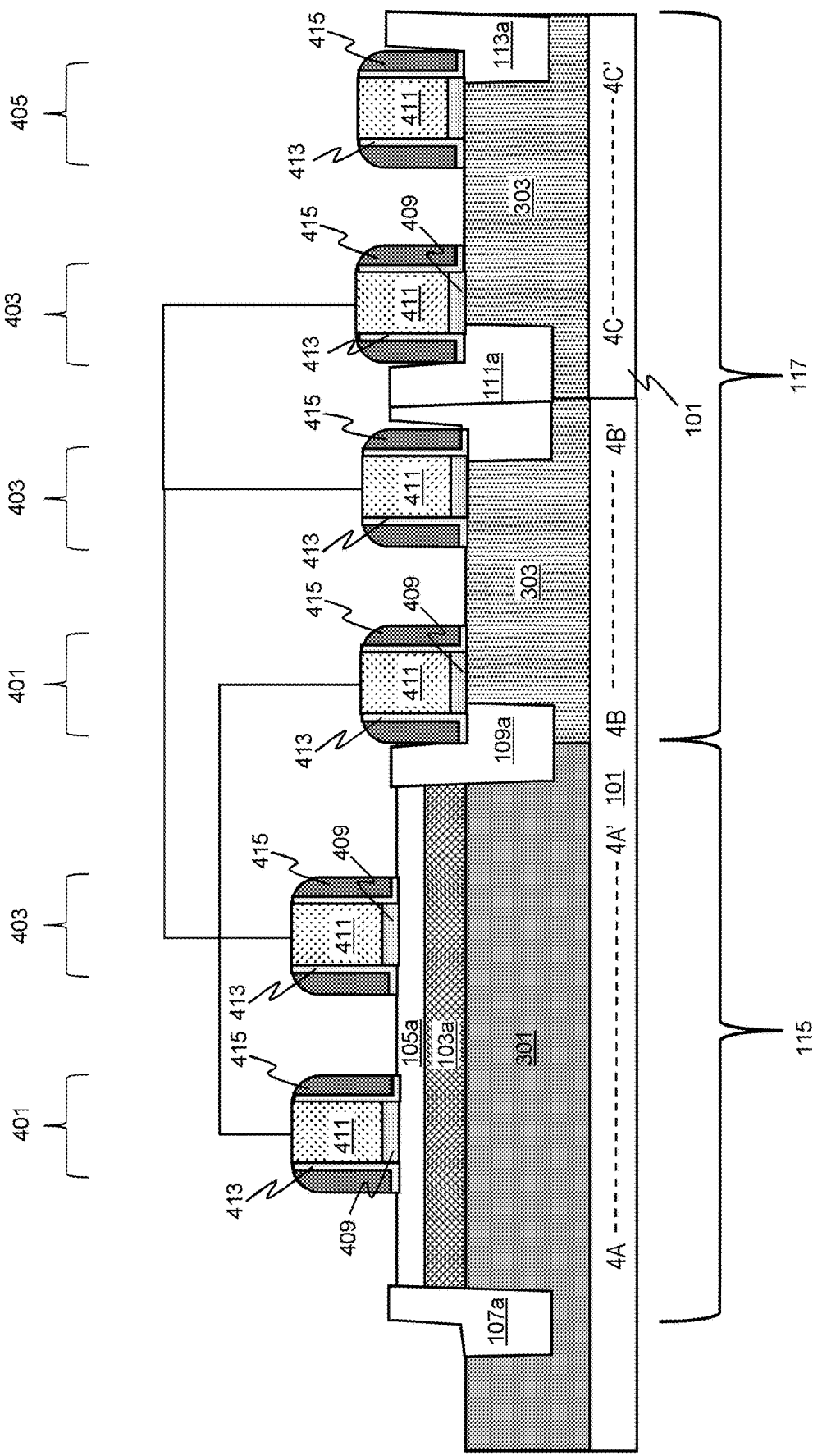
Figure 5:
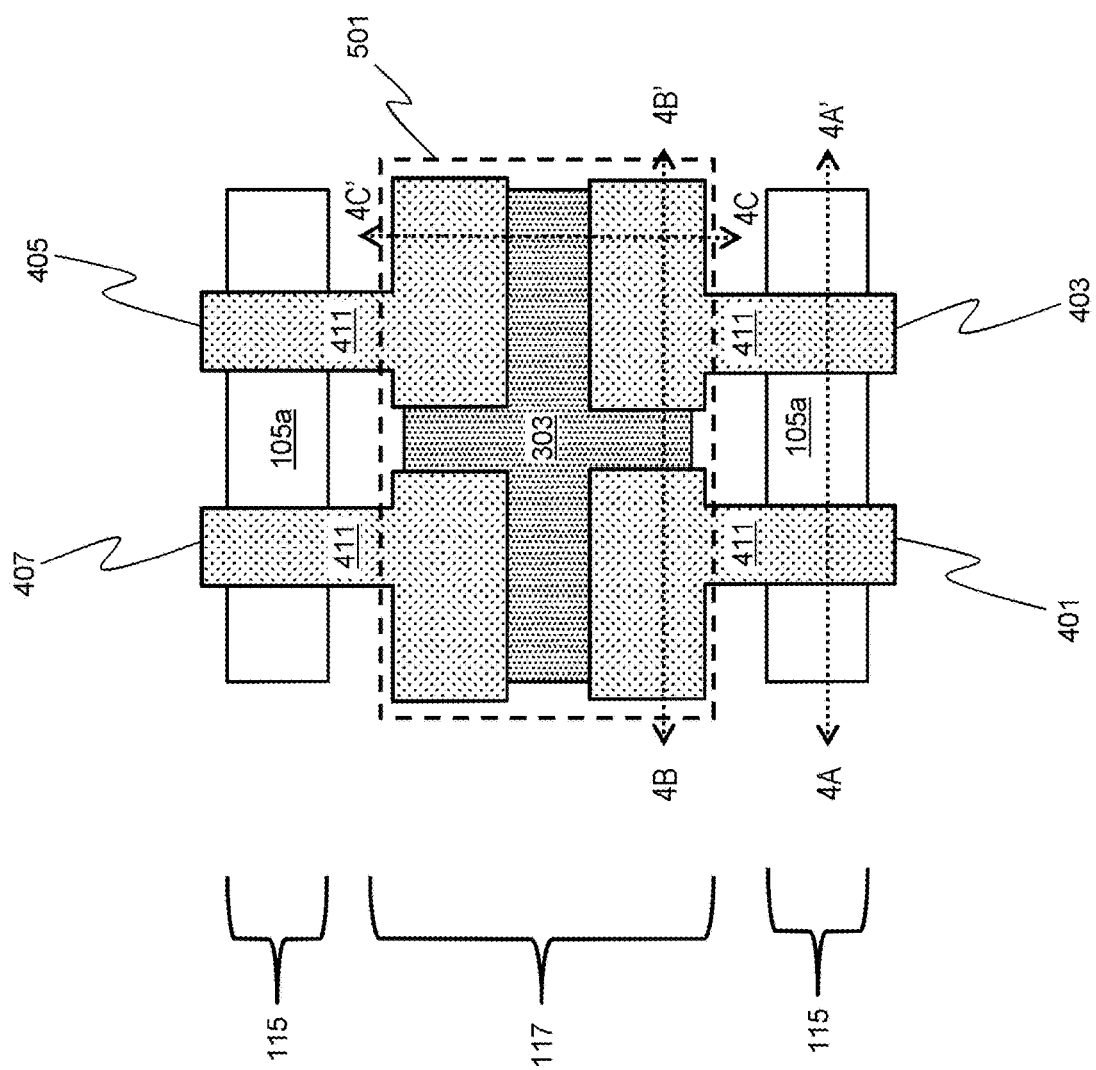
FIGS. 5, 7 and 9 schematically illustrate top views of FIGS. 4, 6 and 8, respectively.
Figure 6:
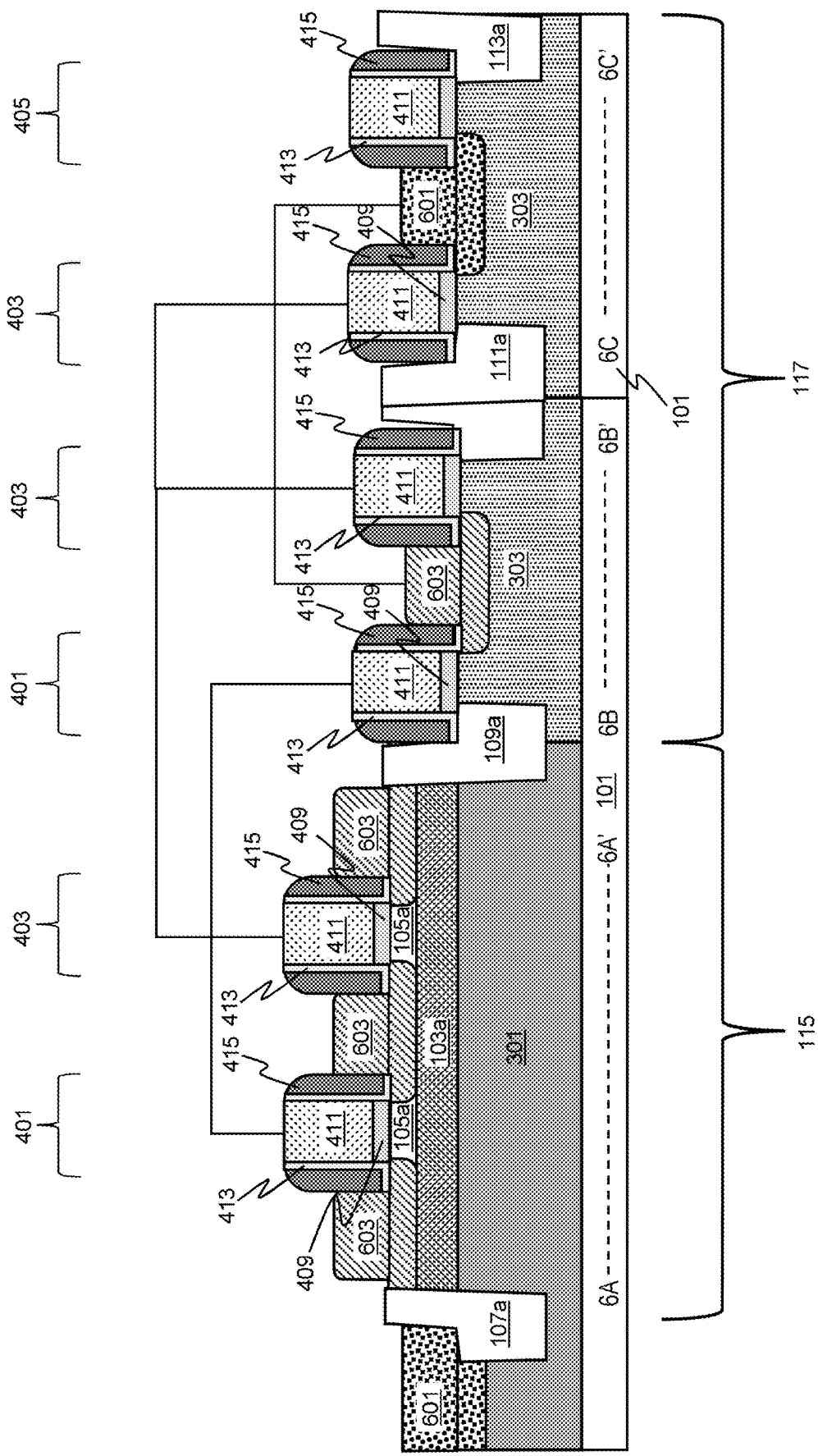
Figure 7:
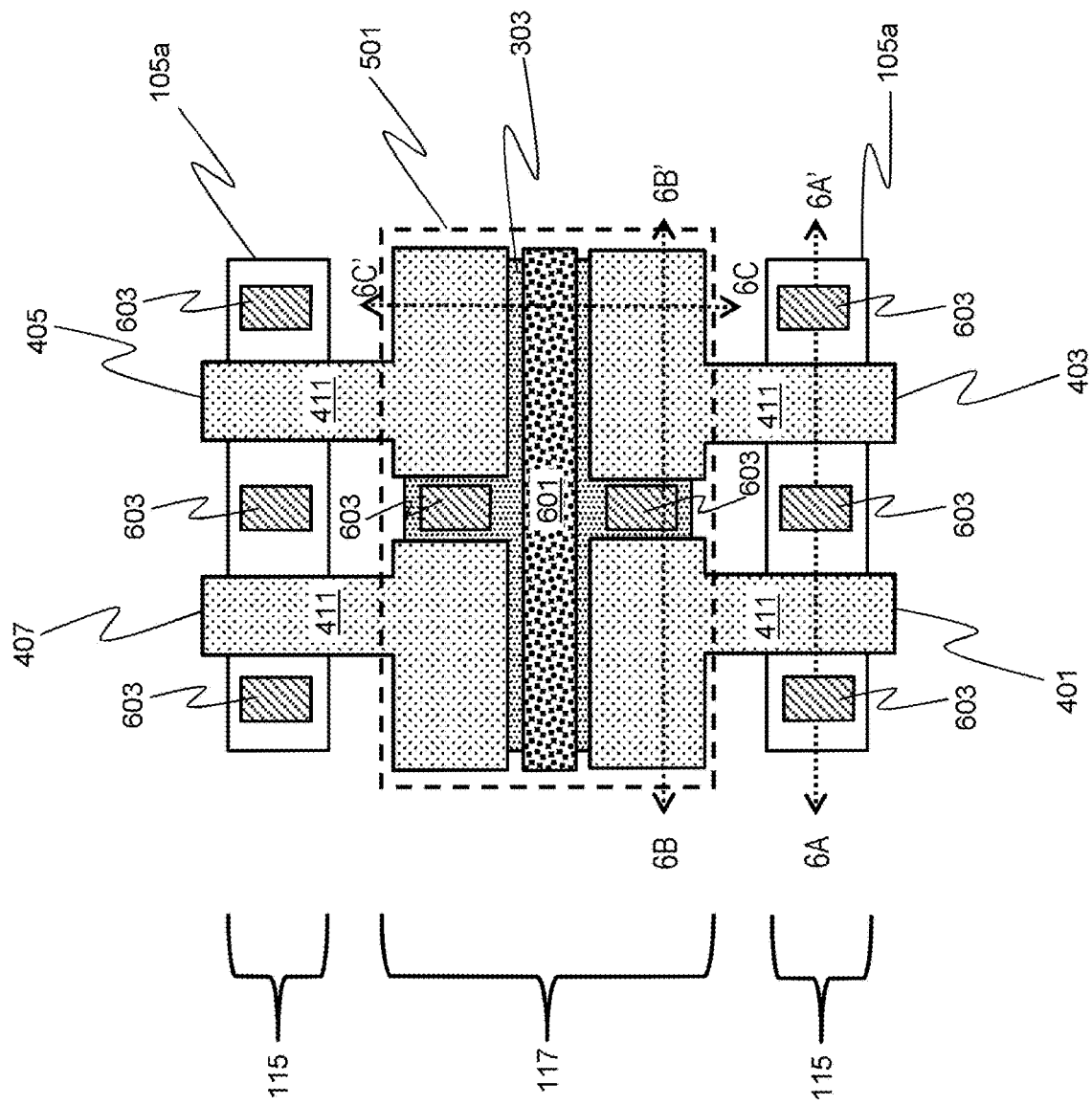
Figure 8:
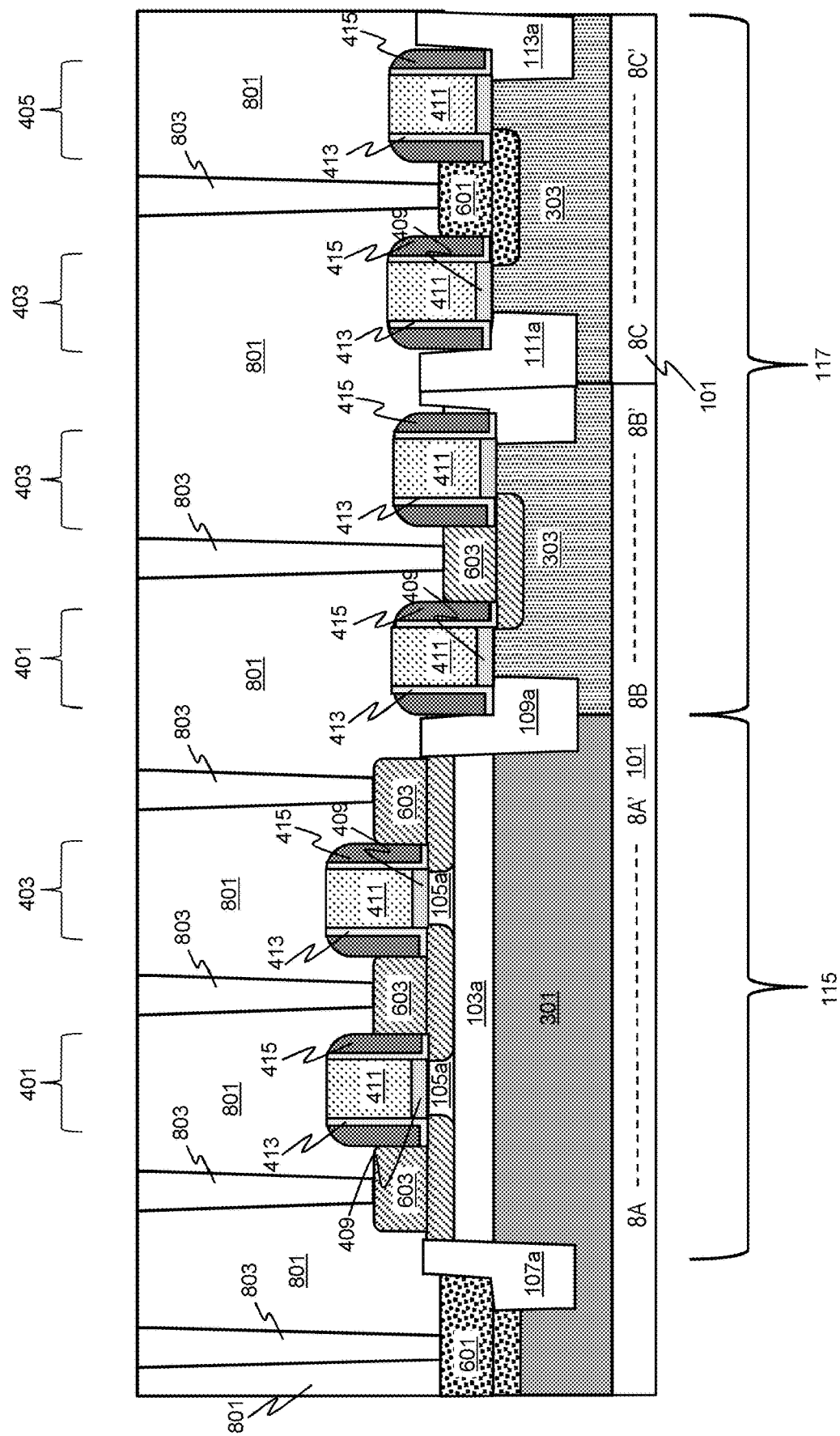
Figure 9:
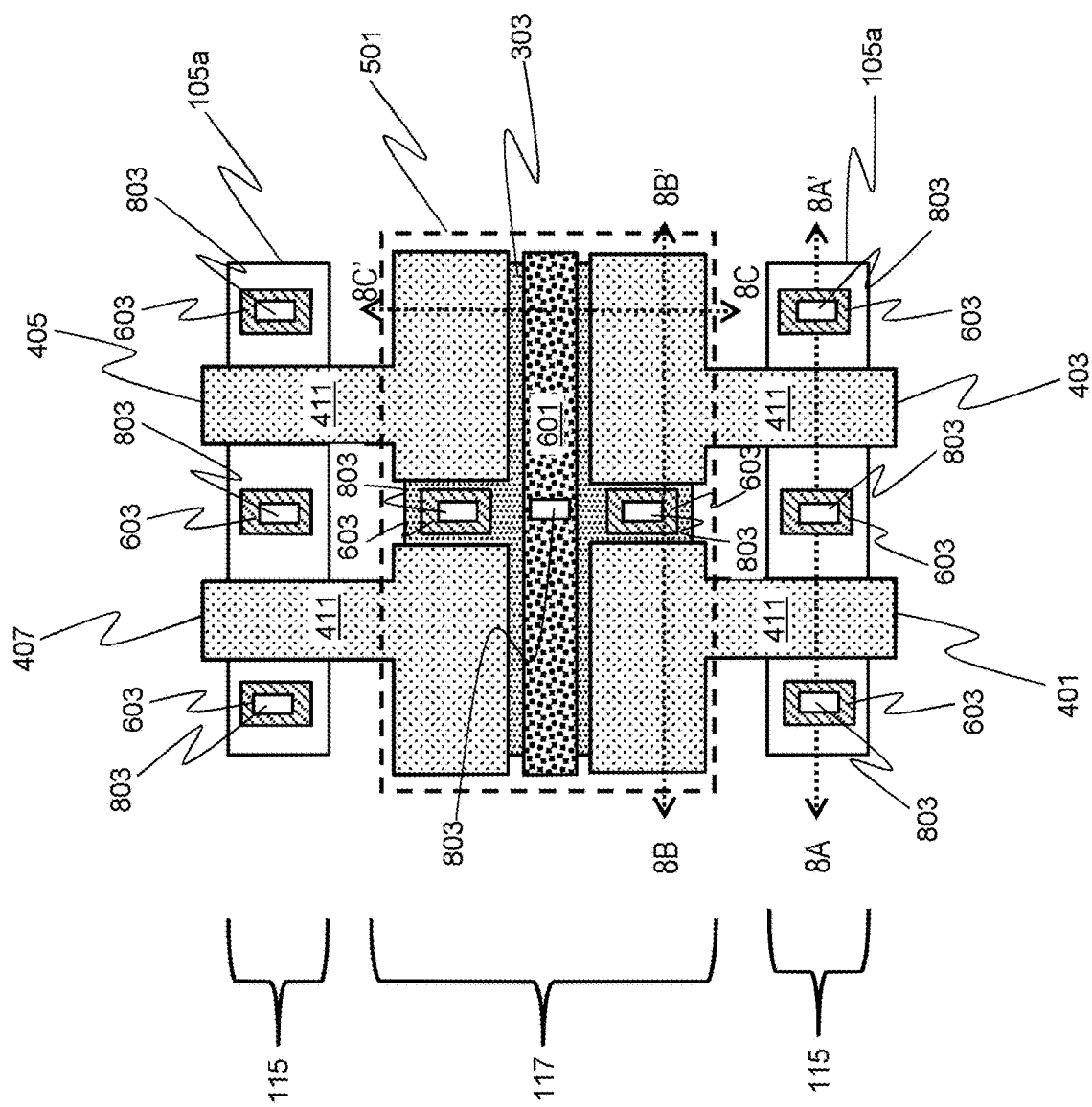

FIGS. 1 through 4, 6, 8 and 10 schematically illustrate cross-sectional views of a process flow for forming a 1T1C MTP on a hybrid SOI and bulk region of a SOI wafer and FIGS. 5, 7, and 9 are top views of FIGS. 4, 6, and 8, respectively, in accordance with an exemplary embodiment. Referring to FIG. 1, a SOI or FDSOI wafer 100 is provided with a Si substrate 101 (handle wafer), a BOX layer 103 and a top Si layer 105. STI structures 107, 109, 111 and 113 are then formed through the top Si layer 105, the BOX layer 103 and a portion of the Si substrate 101. The STI structures 107, 109, 111 and 113 are formed, e.g., of an insulating material such as silicon dioxide ($SiO_2$) or a similar material. Thereafter, the top Si layer 105 and the BOX layer 103 adjacent to the STI structure 107 and in-between the STI structures 109, 111 and 113 are removed, e.g., by a dry etch, reactive ion etch (RIE) or a selective etch process, forming the Si layer 105a and BOX layer 103a, respectively, and the SOI region 115 and the bulk region 117, as illustrated in FIG. 2. Coincidently, a portion of the STI structures 107, 109, 111 and 113 is also removed at this time, forming the STI structures 107a, 109a, 111a and 113a.

Referring to FIG. 3, a PW 301 and an NW 303 are formed, e.g., by using ion implantation or other well-known technology, in a portion of the Si substrate 101 in the SOI region 115 and in the bulk region 117, respectively. In this instance, the PW 301 is p-type doped and NW 303 is n-type doped. Referring to FIGS. 4 and 5, common FG stacks 401, 403, 405 and 407 are formed over both of the SOI region 115 and the bulk region 117 (as highlighted by the box 501), with each common FG stack 401, 403, 405 and 407 over a portion of the NW 303 in the bulk region 117 (cut lines 4B-4B' and 4C-4C') and over and perpendicular to a portion of the top Si layer 105a over the PW 301 in the SOI region 115 (cut line 4A-4A'). In one instance, the common FG stacks 401, 403, 405 and 407 are formed, by first forming a FG dielectric layer 409, e.g., of oxide, nitride, a combination of oxide and nitride, or similar materials to a thickness of 5 nm to 50 nm, over a portion of the Si layer 105a in the SOI region 115 and over a portion of the NW 303 in the bulk region 117. A FG 411 is then formed, e.g., of a polysilicon gate layer or a metal gate layer, over the FG dielectric layer 409. Thereafter, a liner 413 is formed, e.g., by an in-situ-steam-generation (ISSG) oxidation or CVD to a thickness of 2 nm to 10 nm, on the sidewalls of each FG 411 and the FG dielectric layer 409 and over respective portions of the Si layer 105a in the SOI region 115 and the NW 303 in the bulk region 117. Subsequently, a spacer 415 is formed, e.g., of oxide, nitride, a combination of oxide and nitride, or similar materials, over each liner 413.

Referring to FIGS. 6 and 7, a P+ RSD 601 is formed, e.g., by selective epitaxial growth (SEG) of Si with p-type in-situ doping or the like processes, in and over a portion of the NW 303 in the bulk region 117 and a N+ RSD 603 is formed, e.g., by SEG of Si with n-type in-situ doping or the like processes, in and over portions of the Si layer 105a in the SOI region 115 and in and over portions of the NW 303 in the bulk region 117. In some instances, one or more of the N+ RSD 603 may be shared between two common FGs, e.g., common FG 401 and 403.

As illustrated in FIGS. 8 and 9, an ILD 801 is formed over the Si substrate 101. Then, the ILD 801 is planarized, e.g., by chemical mechanical polishing (CMP). Subsequently, a source/drain contact (CA) 803 is formed, e.g., of tungsten (W), through the ILD 801 down to each P+ RSD 601 and N+ RSD 603. Thereafter, the CA 803 is planarized, e.g., by CMP, down to the ILD 801.

Figure 10:
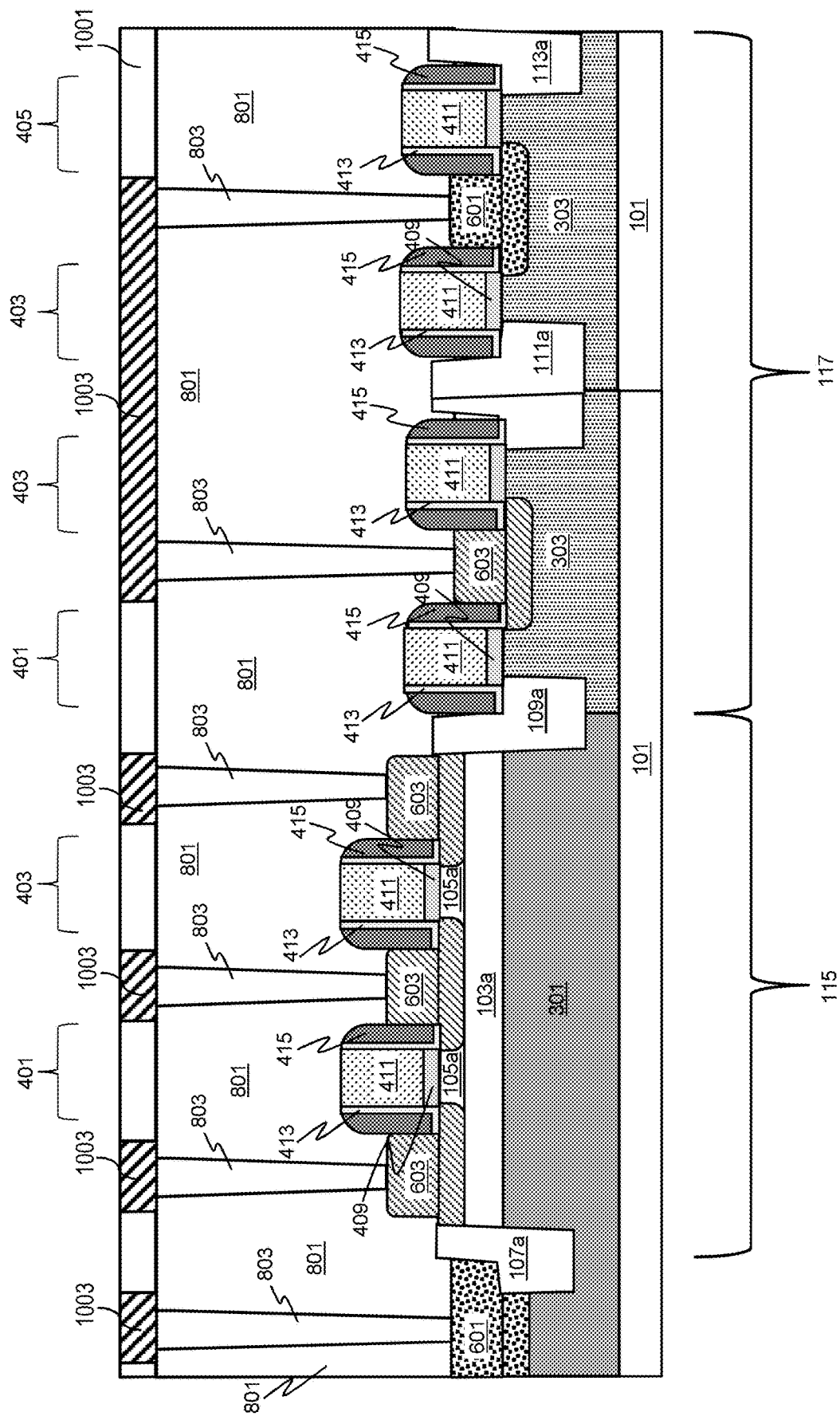

Referring to FIG. 10, an ILD 1001 is formed, e.g., of the same material as the ILD 801, over the ILD 801 and the CA 803 and then planarized, e.g., by CMP. Thereafter, trenches (not shown for illustrative convenience) are formed, e.g., by a dry etch, a RIE or a selective etch process, through the ILD 1001 down to each CA 803 and in some instances between two CA 803, e.g., between the N+ RSD 603 and P+ RSD 601 over the NW 303 in the bulk region 117. Subsequently, a metal layer 1003 is formed, e.g., of copper (Cu) or similar materials, in the trenches and then planarized, e.g., by CMP, down to the ILD 1001.

The resultant device of FIG. 10 may exhibit the following bias properties depicted in Table A; however, it should be noted that the bias properties depicted in Table A are provided for illustration and are not intended as a limitation.

TABLE A

| Bias Table | | PW (V) | SL (V) | BL0 (V) | BL1 (V) | CG (V) |
| --- | --- | --- | --- | --- | --- | --- |
| Prog. | Sel. | 0 | 0~1.5 | 8-10 | 0~1.5 | 8-10 |
| (CHE) | Unsel. | 0 | 0 | 0~1.5 | 0~1.5 | 0 |
| Erase | Sel. | 0 | 0/9.3 | 9.3 | 9.3 | 0 |
| (FN) | Unsel. | 0 | 0 | 0 | 0 | 0 |
| Read | Sel. | 0/Vb | 0 | 0.5~2.5 | 0 | 0~2.5 |
|  | Unsel. | 0/Vb | 0 | 0 | 0 | 0 |

Figure 11:
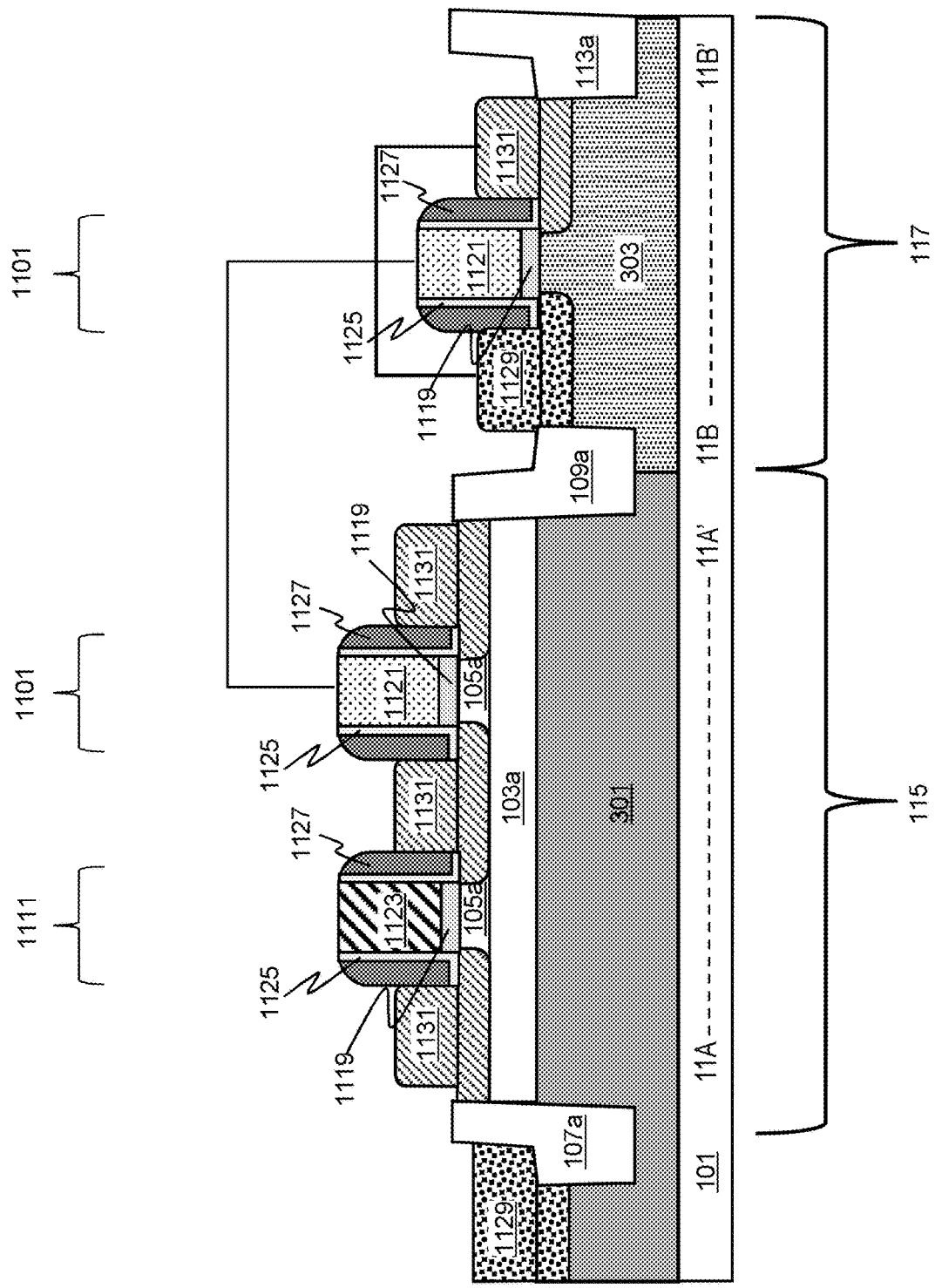
FIG. 11 schematically illustrates a cross-sectional view of a process flow for forming a 2 transistor and 1 capacitor (2T1C) MTP on a hybrid SOI and bulk region of a SOI wafer, in accordance with an exemplary embodiment.
Figure 12:
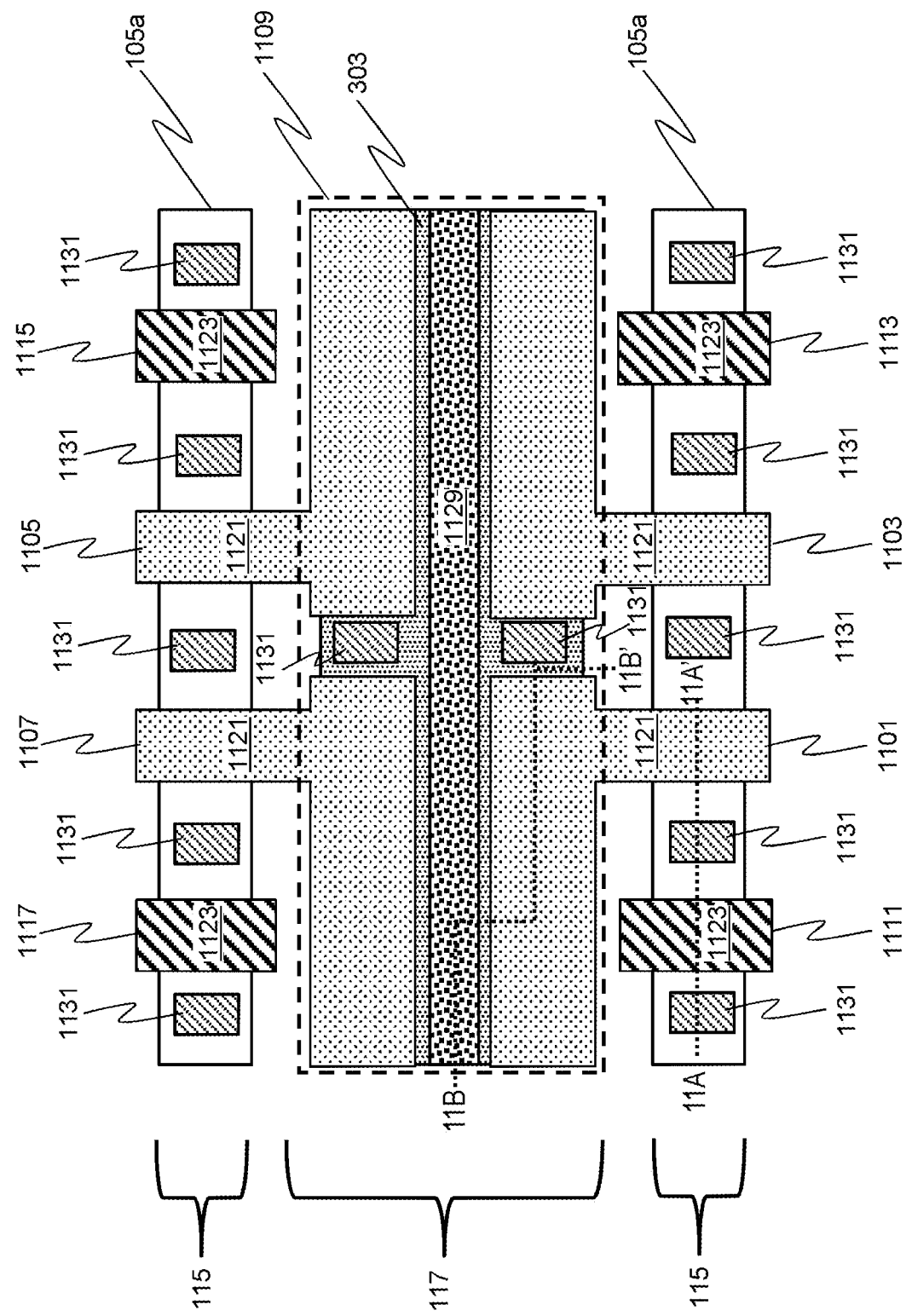
FIG. 12 schematically illustrates a top view of FIG. 11.

FIG. 11 schematically illustrates a cross-sectional view of a process flow for forming a 2T1C MTP on a hybrid SOI and bulk region of a SOI wafer and FIG. 12 schematically illustrates a top view of FIG. 11, in accordance with an exemplary embodiment. Referring to FIGS. 11 and 12, following the process flow described above with respect to FIGS. 1 through 3, a common FG stacks 1101, 1103, 1105 and 1107 are formed over both of the SOI region 115 and the bulk region 117 (as highlighted by the box 1109), with each common FG stack 1101, 1103, 1105 and 1107 over a portion of the NW 303 in the bulk region 117 (cut lines 11B-11B') and over and perpendicular to a portion of the top Si layer 105a over the PW 301 in the SOI region 115 (cut line 11A-11A'). At or about the same time, SG stacks 1111, 1113, 1115, and 1117 are formed over and perpendicular to a portion of the top Si layer 105a over the PW 301 in the SOI region 115 (cut line 11A-11A'). In this instance, the process of forming the common FG stacks 1101, 1103, 1105 and 1107 and the SG stacks 1111, 1113, 1115 and 1117 is similar to the process flow described in FIG. 4, by first forming a FG dielectric layer 1119, e.g., of oxide, nitride, a combination of oxide and nitride, or similar materials to a thickness of 5 nm to 50 nm, over a portion of the Si layer 105a in the SOI region 115 and over a portion of the NW 303 in the bulk region 117. A FG 1121 and SG 1123 is then formed, e.g., of a polysilicon gate layer or a metal gate layer, over the FG dielectric layer 1119 for each of the FG stacks 1101, 1103, 1105 and 1107 and the SG stack 1111, 1113, 1115 and 1117, respectively. Thereafter, a liner 1125 is formed, e.g., by an in-situ-steam-generation (ISSG) oxidation or CVD to a thickness of 2 nm to 10 nm, on the sidewalls of each FG 11121, SG 1123 and the FG dielectric layer 1119 and over respective portions of the Si layer 105a in the SOI region 115 and the NW 303 in the bulk region 117. Subsequently, a spacer 1127 is formed, e.g., of oxide, nitride, a combination of oxide and nitride, or similar materials, over each liner 1125.

A P+ RSD 1129 is then formed, e.g., by SEG of Si with p-type in-situ doping or the like processes, in and over a portion of the NW 303 in the bulk region 117, and a N+ RSD 1131 is formed, e.g., by SEG of Si with n-type in-situ doping or the like processes, in and over portions of the Si layer 105a in the SOI region 115 and in and over portions of the NW 303 in the bulk region 117. Thereafter, the process steps described with respect to FIGS. 8, 9 and 10 are repeated (substituting the P+ RSD 1129 and the N+ RSD 1131 for the P+ RSD 601 and the N+ RSD 603, respectively).

The resultant device of FIG. 11 may exhibit the following bias properties depicted in Table B; however, it should be noted that the bias properties depicted in Table B are provided for illustration and are not intended as a limitation.

TABLE B

| Bias Table | | PW (V) | SL (V) | BL0 (V) | BL1 (V) | SG (V) | CG (V) |
|---|---|---|---|---|---|---|---|
| Prog. (CHE) | Sel. | 0 | 0~1.5 | 8-10 | 0~1.5 | 0.5~1.5 | 8-10 |
|  | Unsel. | 0 | 0 | 0~1.5 | 0~1.5 | 0 | 0 |
| Erase (FN) | Sel. | 0 | 0/9.3 | 9.3 | 9.3 | 0 | 0 |
|  | Unsel. | 0 | 0 | 0 | 0 | 0 | 0 |
| Read | Sel. | 0/Vb | 0 | 0.5~2.5 | 0 | 0.5~2.5 | 0.5~2.5 |
|  | Unsel. | 0/Vb | 0 | 0 | 0 | 0 | 0 |

Figure 13:
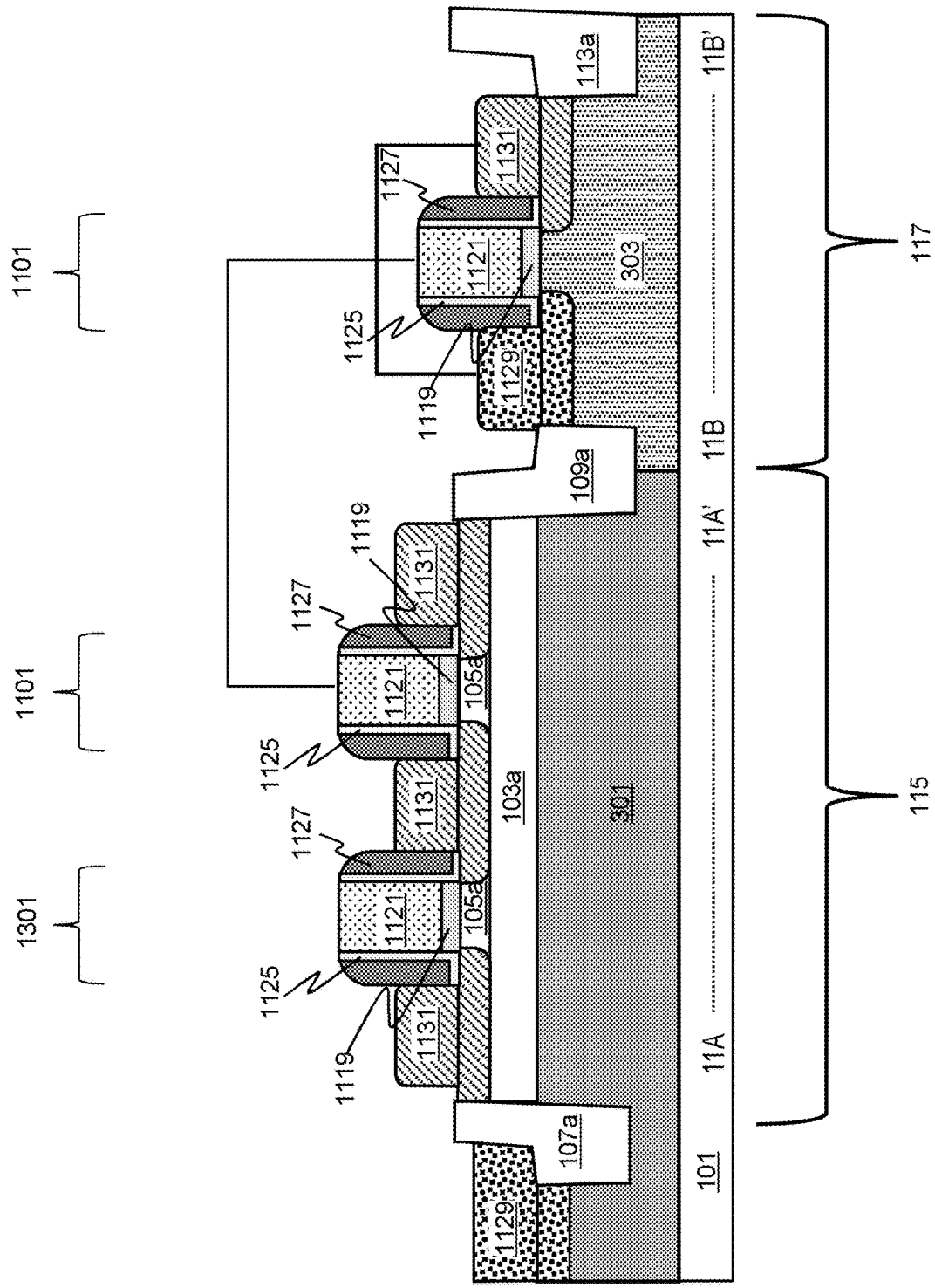
FIGS. 13, 14 and 15 schematically illustrate cross-sectional views of variations of a compact hybrid SOI and bulk MTP cell, in accordance with an exemplary embodiment.
Figure 14:
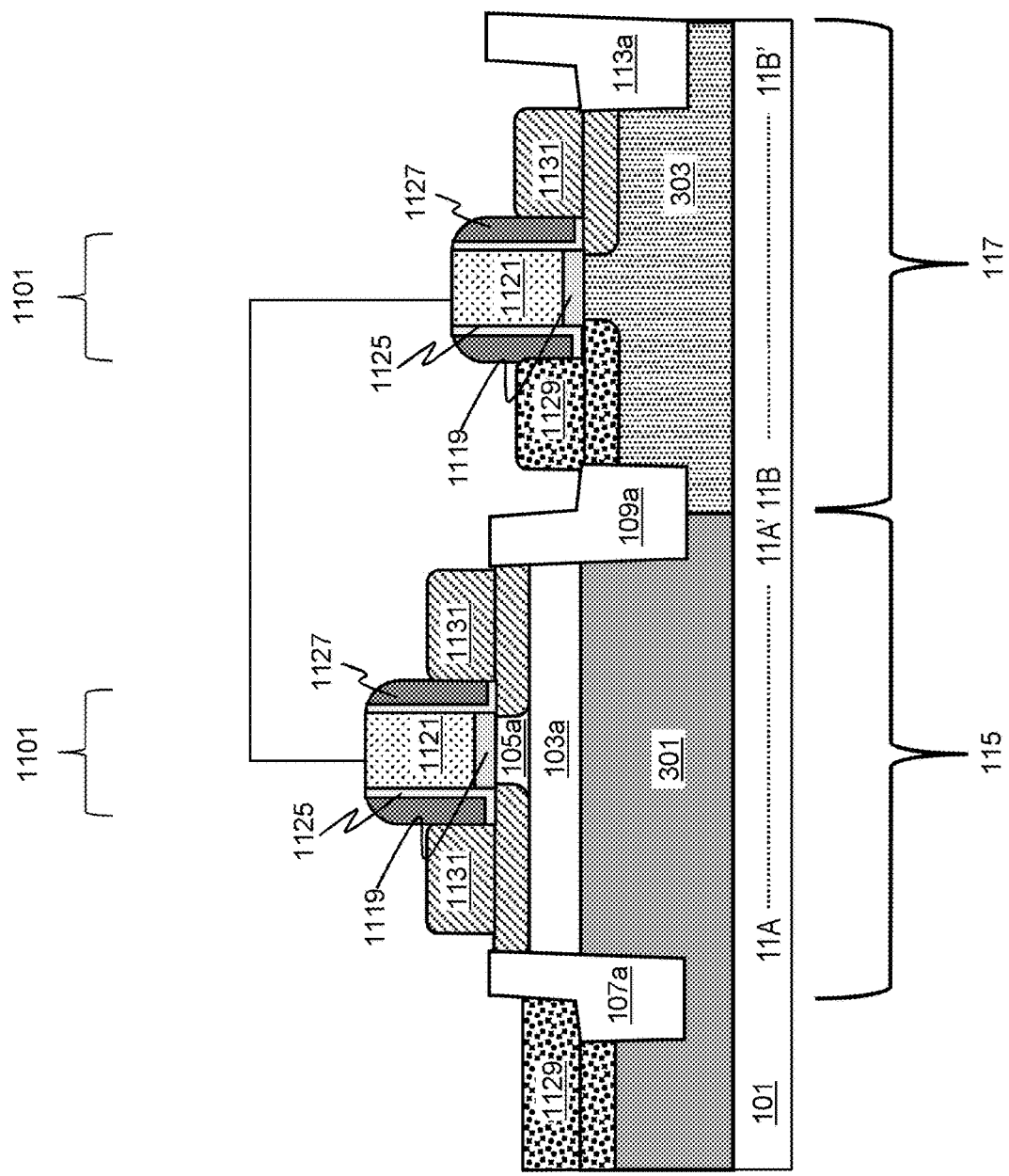
Figure 15:
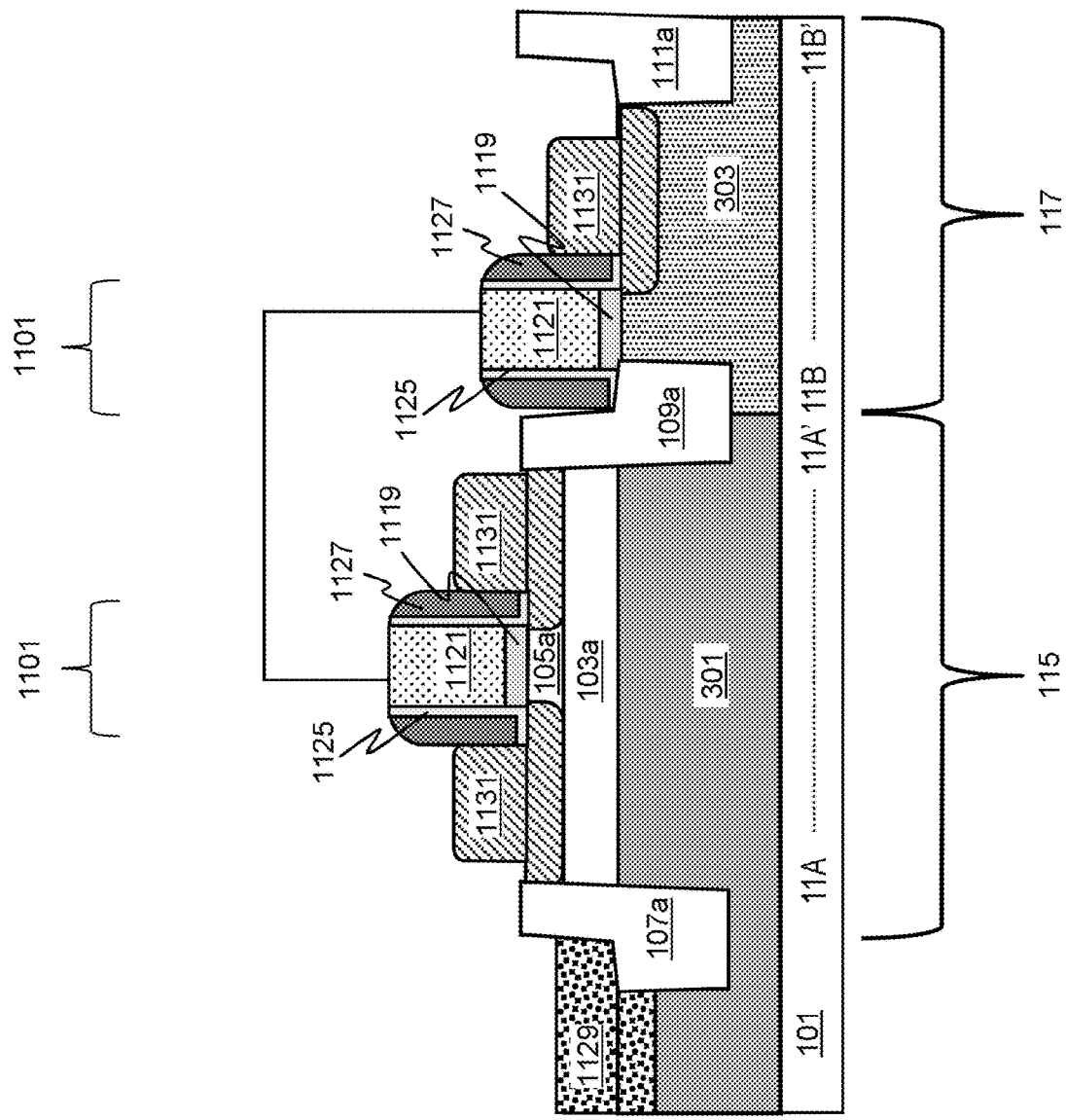

FIGS. 13, 14 and 15 schematically illustrate respective cross-sectional views of variations of a compact hybrid SOI and bulk MTP cell, in accordance with an exemplary embodiment. The resultant structure and formation of FIG. 13 is similar to the structure of FIG. 11, however, a FG 1301 is formed instead of the SG 1123. FIGS. 14 and 15 are also device specific variations of FIG. 11 as well. It should be understood that various combinations of the structures depicted in FIGS. 13, 14 and 15 are also possible with one or more SG stacks (not shown for illustrative convenience).

The embodiments of the present disclosure can achieve several technical effects, such as a low cost (zero mask adder) and compact hybrid SOI and bulk MTP with enhanced performance and scaling advantage relative to known MTP designs. In addition, the channel on SOI allows for higher voltage for faster erase due to no limitation on junction breakdown and thus no tailored junction implant mask is required. Also, better read margin due to improved FDSOI transistor (xtor) performance (higher current on (Ion) and lower leakage). Further, the coupling capacitance on bulk allows better area scaling and flexibility. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any IC devices with MTP memory devices on SOI or FDSOI architecture.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a bulk region in a portion of a silicon on insulator (SOI) wafer;
   an n-type well (NW) in the bulk region in a silicon (Si) substrate of the SOI wafer and a p-type well (PW) in the Si substrate of an SOI region of the SOI wafer;
   a first pair of common floating gate (FG) stacks comprising a first common FG stack and a second FG stack;
   a second pair of common FG stacks comprising a third common FG stack and a fourth common FG stack;
   a third pair of common FG stacks comprising a fifth common FG stack and a sixth common FG stack which are over and perpendicular to the bulk region and a portion of the NW;
   the first and third common FG stacks are over and perpendicular the SOI region and a portion of the PW, the second and fourth common FG stacks are over and perpendicular the bulk region and a portion of the NW;
   a first shared N+raised source/drain (RSD) between the first and third common FG stacks on a top Si layer of the SOI wafer;
   an N+RSD in the top Si layer on an opposite side of the first and third common FG stacks within the SOI region with respect to the first shared N+RSD;
   a second shared N+RSD between the second and fourth common FG stacks on the Si substrate of the bulk region; and
   a P+RSD between the fifth and sixth common FG stacks on the Si substrate of the bulk region.

2. The device according to claim 1, further comprising:
   a first pair of shallow trench isolation (STI) structures through the top Si layer, a buried oxide (BOX) layer of the SOI wafer, and a portion of the Si substrate, each first STI structure adjacent to and on opposite sides of the first pair of common FG stacks and the second pair of common FG stacks; and
   a second pair of STI structures, laterally separated and perpendicular to the first pair of STI structures, through the top Si layer, the BOX layer, and the portion of the Si substrate.

3. The device according to claim 1, further comprising:
   a dielectric layer over a portion of the top Si layer of the SOI region and over a portion of the Si substrate of the bulk region and under each common FG stack.

4. The device according to claim 1, wherein each common FG stack of the first pair and the second pair comprises a polysilicon gate layer or a metal gate layer.

5. The device according to claim 1, further comprising:
   a liner along each sidewall of each common FG stack of the first pair and the second pair and each SG stack; and
   a spacer along each liner,
   wherein each of the first shared N+RSD, the N+RSD, the second shared N+RSD, and the P+RSD are formed adjacent to a respective spacer.

6. The device according to claim 1, wherein each of the first shared N+RSD, the N+RSD, the second shared N+RSD, and the P+RSD comprises an in situ doped RSD.

7. The device according to claim 1, further comprising:
   a first interlayer dielectric (ILD) layer over the SOI wafer;
   a source/drain (CA) contact through the ILD layer down to each of the first shared N+RSD, the N+RSD, the second shared N+RSD, and the P+RSD;
   a second ILD over the SOI wafer;
   a first metal layer in the second ILD on each CA over each of the first shared N+RSD and the N+RSD; and
   a second metal layer in the second ILD over and between the CA over each of the second shared N+RSD and the P+RSD.

8. A device comprising:
a bulk region in a portion of a silicon on insulator (SOI) wafer;
an n-type well (NW) in the bulk region in a silicon (Si) substrate of the SOI wafer and a p-type well (PW) in the Si substrate of an SOI region of the SOI wafer;
a first pair of common floating gate (FG) stacks comprising a first common FG stack and a second FG stack;
a second pair of common FG stacks comprising a third common FG stack and a fourth common FG stack;
a third pair of common FG stacks comprising a fifth common FG stack and a sixth common FG stack which are over and perpendicular to the bulk region and a portion of the NW;
the first and third common FG stacks are over and perpendicular the SOI region and a portion of the PW, the second and fourth common FG stacks are over and perpendicular the bulk region and a portion of the NW;
a first shared N+raised source/drain (RSD) between the first and third common FG stacks on a top Si layer of the SOI wafer;
an N+RSD in the top Si layer on an opposite side of the first and third common FG stacks within the SOI region with respect to the first shared N+RSD;
a plurality of select gate (SG) stacks, each SG stack over a portion of the PW on an opposite side of the second shared N+RSD with respect to the first shared N+RSD;
an N+RSD in the top Si layer on an opposite side of the SG stack from the second shared N+RSD;
a third shared N+RSD the second and fourth common FG stacks on the Si substrate of the bulk region; and
a P+RSD between the fifth and sixth common FG stacks on the Si substrate of the bulk region.

9. The device according to claim 8, further comprising:
a first pair of shallow trench isolation (STI) structures through the top Si layer, a buried oxide (BOX) layer of the SOI wafer, and a portion of the Si substrate, wherein the first pair of STI structures is adjacent to and on opposite sides of the first pair of common FG stacks and the second pair of common FG stacks; and
a second pair of STI structures, laterally separated and perpendicular to the first pair of STI structures, through the top Si layer, the BOX layer, and the portion of the Si substrate.

10. The device according to claim 8, further comprising a dielectric layer over a portion of the top Si layer of the SOI region and over a portion of the Si substrate of the bulk region and under each common FG stack.

11. The device according to claim 8, wherein each common FG stack of the first pair and the second pair and each SG stack comprises a polysilicon gate layer or a metal gate layer.

12. The device according to claim 8, further comprising:
a liner along each sidewall of each common FG stack of the first pair and the second pair and each SG stack; and
a spacer along each liner.

13. The device according to claim 8, wherein each of the first shared N+RSD, the N+RSD, the second shared N+RSD, and the P+RSD comprises an in situ doped RSD.

14. The device according to claim 8, further comprising:
a first interlayer dielectric (ILD) layer over the SOI wafer;
a source/drain (CA) contact through the ILD layer for each of the first shared N+RSD, the N+RSD, the second shared N+RSD, and the P+RSD;
a second ILD over the SOI wafer;
a first metal layer in the second ILD on each CA over each of the first shared N+RSD and the N+RSD; and
a second metal layer in the second ILD over and between the CA over each of the second shared N+RSD and the P+RSD.

* * * * *